United States Patent [19]
Kata et al.

[11] Patent Number: 5,283,081
[45] Date of Patent: Feb. 1, 1994

[54] PROCESS FOR MANUFACTURING A CERAMIC WIRING SUBSTRATE HAVING A LOW DIELECTRIC CONSTANT

[75] Inventors: Keiichiro Kata; Yoshinobu Kobayashi; Yuzo Shimada, all of Tokyo, Japan

[73] Assignee: NEC Corporation, Tokyo, Japan

[21] Appl. No.: 848,855

[22] Filed: Mar. 10, 1992

[30] Foreign Application Priority Data

Mar. 14, 1991 [JP] Japan .................. 3-49644

[51] Int. Cl.$^5$ .............................................. B05D 5/12
[52] U.S. Cl. ........................................ 427/96; 427/97; 427/99
[58] Field of Search .................... 427/96, 97, 99

[56] References Cited

U.S. PATENT DOCUMENTS

| | | | |
|---|---|---|---|
| 4,226,932 | 10/1980 | Ferraris | 427/96 |
| 4,562,092 | 12/1985 | Wiech, Jr. | 427/96 |
| 4,578,279 | 3/1986 | Zingher | 427/96 |
| 4,684,543 | 8/1987 | Baudry | 427/96 |
| 5,055,164 | 10/1991 | Hawkins et al. | 427/96 |
| 5,162,240 | 11/1992 | Saitou et al. | 427/96 |

FOREIGN PATENT DOCUMENTS 2-116196 4/1990 Japan .
3-83850 4/1991 Japan .
3-108832 5/1991 Japan .
3-141153 6/1991 Japan .

*Primary Examiner*—R. Bruce Breneman
*Attorney, Agent, or Firm*—Burns, Doane, Swecker & Mathis

[57] ABSTRACT

A process for manufacturing a hybrid multilayer ceramic wiring substrate having a low dielectric constant includes a conductor wiring forming step and an insulating layer forming step. The conductor wiring forming step comprises the steps of: applying a photoresist upon a multilayer ceramic wiring substrate in which a plurality of conductor layers are laminated via insulation layers formed of a low temperature sinterable ceramic composition having a low dielectric constant; exposing the photoresist to light and developing the exposed photoresist to form a mask pattern; and selectively plating the mask pattern. The insulating layer forming step comprises the steps of: printing a photosetting paste for an insulating layer on the substrate and drying the paste; forming a via hole pattern by light exposure and development using a mask; and burying and sintering a conductor paste into via holes. A micro multilayer wiring is formed by a combination of the conductor wiring forming step and the insulating layer forming step, whereby high density micro wiring and high speed transmission are attained.

12 Claims, 4 Drawing Sheets

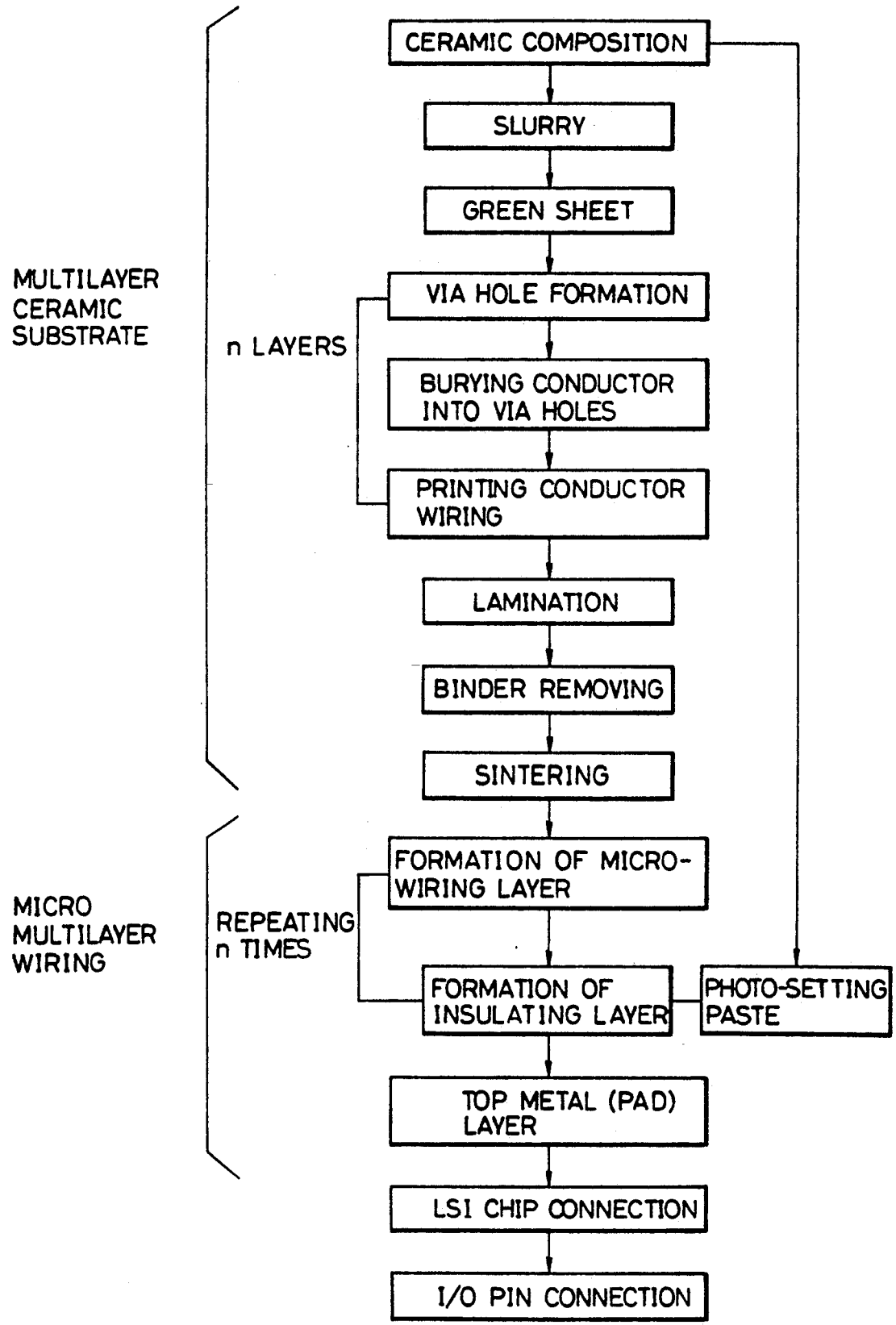

PROCESS FOR MANUFACTURING A CERAMIC WIRING SUBSTRATE HAVING A LOW DIELECTRIC CONSTANT

BACKGROUND OF THE INVENTION

1. Field of the Invention

The present invention relates to a process for manufacturing a ceramic wiring substrate or board and in particular to a process for manufacturing a hybrid multilayer ceramic wiring substrate having a low dielectric constant on which ultra high speed LSI chips are mounted.

2. Prior Art

Semiconductor devices such as ICs and LSIs have heretofore been mounted or packaged on printed circuit boards of glass epoxy or alumina ceramic substrates. In association with an advance in high integration, reduction in size and speeding-up of semiconductor devices, demand for mounting substrates which meet the requirements for high density wiring, high speed transmission and high frequency and high heat dissipation has been increased.

Conventional printed boards have problems in through-hole plating properties, machining properties, multilayer bonding ability and thermal deformation at high temperatures, so that they have a limited density. Accordingly, the printed board has not been yet put into practical use as a high density mounting substrate. In contrast to this, the ceramic substrate has a higher potential for high density mounting substrate.

Since the alumina substrate should be sintered at elevated temperatures not less than 1500° C., a conductor material for wiring which is simultaneously sintered or fired is limited to refractory metals or high melting point metals such as W, Mo and the like having a relatively high resistivity. Accordingly, if the transmission loss of pulse signal is considered, reduction in size of wiring pattern would be restricted.

On the other hand, since the propagation delay time of pulse signal is proportional to the square root of the dielectric constant of the substrate material, the low dielectric constant of the substrate material is essential to achieve a high speed transmission. However, the alumina substrate has a relatively high dielectric constant of about 10.

It is a low-temperature sinterable multilayer ceramic substrate that has been developed. The insulating material includes a material such as composite materials of ceramics with glass and crystallized glass. Since the above materials can be sintered at a temperature not higher than 1000° C., low melting point metals, such as Au, Ag-Pd, Cu or the like, having a low resistivity can be used as a wiring conductor material It is possible to lower the dielectric constant of the insulating material not more than 5 by choice of ceramics or glass having a low dielectric constant Since a green sheet lamination technique can be used, it is possible to make three-dimensional wiring, which is very advantageous to obtain a high density.

Formation of the wiring pattern in the green sheet lamination technique is generally performed by a thick film screen printing method. The lower limit of the width of line and space in mass production is 75 μm. Accordingly, a new approach and structure is necessary for micro wiring.

SUMMARY OF THE INVENTION

Therefore, it is an object of the present invention to provide a process for manufacturing a hybrid multilayer ceramic wiring substrate having a low dielectric constant which has overcome such prior art problems.

In order to accomplish the above object of the present invention, there is provided a process for manufacturing a hybrid multilayer ceramic wiring substrate having a low dielectric constant including a conductor wiring forming step and an insulating layer forming step, the conductor wiring forming step comprising the steps of: applying a photoresist upon a multilayer ceramic wiring substrate in which a plurality of conductor layers are laminated via insulation layers formed of a low temperature sinterable ceramic composition having a low dielectric constant; exposing the photoresist to light and developing the exposed photoresist to form a mask pattern; and selectively plating the mask pattern; the insulating layer forming step comprising the steps of: printing a photo-setting paste for an insulating layer on the multilayer ceramic wiring substrate and drying the paste; forming a via hole pattern by light exposure and development using a mask; and burying and sintering a conductor paste into via holes; a micro multilayer wiring being formed by a combination of the conductor wiring forming step and the insulating layer forming step.

According to the present invention, the hybrid multilayer ceramic wiring substrate having a low dielectric constant is manufactured by using a ceramic composition having a low dielectric constant which can be sintered at a low temperature not higher than about 1000° C. and by forming a micro multilayer wiring, whereby high speed transmission and high density micro wiring is achieved.

BRIEF DESCRIPTION OF THE DRAWINGS

The aforementioned and other objects, features and advantages of the present invention will become more apparent from the following description taken with reference to the accompanying drawings, wherein:

FIG. 2 is a flow chart showing a process for manufacturing a substrate according to the present invention;

DETAILED DESCRIPTION OF THE PREFERRED EMBODIMENTS

The present invention will be described in more detail with reference to the accompanying drawings.

Figure 1:
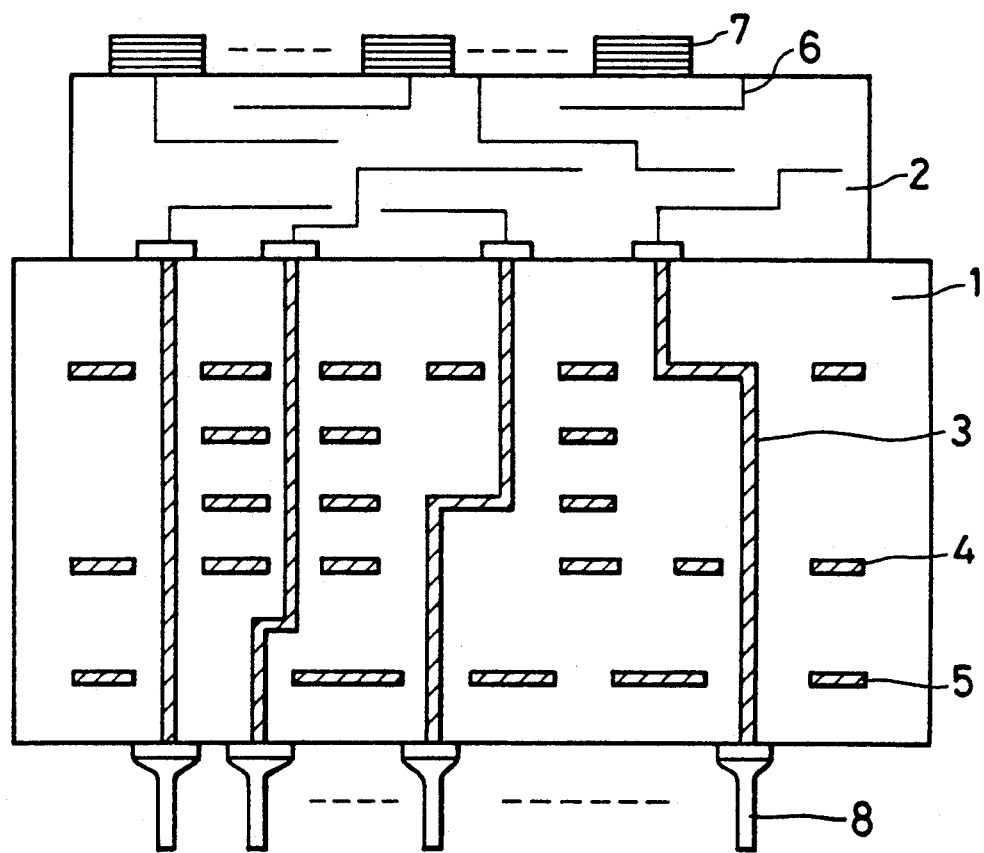
FIG. 1 is a structural sectional view showing a hybrid multilayer wiring substrate having a low dielectric constant according to present invention.

Referring now to FIG. 1, there is shown a sectional view of a hybrid multilayer ceramic wiring substrate having a low dielectric constant according to the present invention. The multilayer ceramic substrate is a hybrid substrate including a multilayer ceramic substrate which is manufactured by the green sheet lamination technique and a micro multilayer wiring which is manufactured by a combination of a lithography and a thick film multilayer method as shown in FIG. 1. A reference numeral 1 denotes the multilayer ceramic substrate having a low dielectric constant, 2 the micro multilayer wiring, 3 via holes, 4 ground layer, 5 a power source layer, 6 a signal layer, 7 an LSI chip, 8 input/output pins. FIG. 2 shows a process for manufacturing a substrate according to the present invention.

The first embodiment of the present invention in which a three-component ceramic composition including as ceramic materials 20% by weight of cordierite, 15% by weight of quartz glass and 65% by weight of borosilicate glass is used will be described. The borosilicate glass includes as main components about 75.3% by weight of silicon oxide, about 19.0% by weight of boron oxide, about 1.4% by weight of aluminum oxide; about 2.3% by weight of an oxide of an element of group I; about 0.13% by weight of an oxide of an element of group II; and about 0.03% by weight of titanium oxide, if the components are expressed in terms of oxides. The present composition is one of the compositions set forth in Japanese Patent Public Disclosure No. 83850/1991 (Japanese Patent Application No. 218707/1989).

This ceramic composition is manufactured by a process as follows:

For the preparation of the borosilicate glass, a batch is prepared by weighing the raw material of each component to obtain a desired composition. The batch is heated at high temperatures not less than 1400° C. for 2 to 4 hours so that it will be molten and vitrified. The molten glass is cooled with water or cast on a thick iron plate so that it is formed into flakes. The resultant glass flakes are pulverized by means of an alumina ball mill or the like to obtain glass powders having an average particle size of 0.5 to 3 μm. On the other hand, the cordierite and the quartz glass are pulverized into fine powders having an average particle size of 0.5 to 5 μm.

The borosilicate glass powders which were obtained by the above mentioned process are blended with the cordierite and quartz glass powders to obtain a desired composition and the resultant composition is mixed for 1 to 3 hours by a ball mill or the like. Powders in which the borosilicate glass powders and the cordierite-quartz glass powders are uniformly mixed with each other, i.e., a low temperature sinterable ceramic composition having a low dielectric constant can be obtained. Although the borosilicate glass powders are expressed in terms of oxides for simplicity, they may be used in the form of ores, oxides, carbonates, hydrates or the like by a conventional method.

Firstly, a multilayer ceramic wiring substrate 1 should be prepared. The substrate is formed of the thus obtained powdery ceramic composition by the green sheet lamination technique. That is, a vehicle is added to and mixed with the powders and then the mixture is sufficiently kneaded by using a high speed mixer, a ball mill or the like so that the powders are uniformly dispersed in the vehicle to prepare a slurry. The slurry is formed into a green sheet having a film thickness which is suitable to form an insulating layer by a slip casting method. Organic vehicles such as solvents or binders which are usually used will suffice and it is not necessary to limit the components.

Then, the sheet is formed with through-holes through which upper and lower conductors are connected with each other. Conductors are printed thereon and printing is performed so that the through-holes are filled with electrically conductive paste. The conductors may be formed of gold, silver or silver-palladium paste. The paste is laminated and is subjected to thermal compression bonding with each other to form a desired multilayer structure. After the organic vehicle which has been added on formation of the sheet is removed, the multilayer structure is sintered. A multilayer ceramic wiring substrate is thus obtained.

The characteristics of the present substrate are shown in Table 1.

TABLE 1

| Composition | Cordierite/quartz glass/borosilicate glass |
|---|---|
| Sintering temperature (°C.) | 950 |
| Density of sintered material (g/cm$^3$) | 2.24 |
| Sintering shrinkage factor (%) | 14.6 |
| Shrinkage factor deviation (%) | <±0.3 |
| Dielectric constant (1 MHz) | 4.4 |
| Dielectric loss (%) | 0.2 |
| Insulation resistance (Ω · cm) | >10$^{14}$ |
| Thermal expansion coefficient (× 10$^{-7}$/°C.) | 32 |
| Flexural strength (kg/cm$^2$) | 1600 |
| Warpage (μm/100 mm) | 20 |
| Surface roughness (μm Ra) | 0.4 |

Table 1 shows that the main features of the present substrate 1 reside in that the dielectric constant is as low as 4.4 so that it is advantageous for high speed transmission of signals and that the thermal expansion coefficient is very approximate to that of Si so that bare chip packaging is possible. In addition, the shrinkage factor deviation can be suppressed not higher than ±0.3%.

The present substrate 1 includes only the ground layer 4, the power source layer 5 and a part of signal layer 6 as conductive layers. Most of the signal layer 6 which connects LSI chips 7 requiring micro wiring with each other will be formed in a micro wiring portion which will be described hereafter.

The micro wiring portion is then formed on the thus formed multilayer ceramic wiring substrate 1.

A typical composition of the photo-setting insulating paste which is used in the first embodiment of the present invention is shown in Table 2.

TABLE 2

| Component | Ratio |
|---|---|
| Ceramic powders | |
| Cordierite (20% by weight) Quartz glass (15% by weight) Borosilicate glass (65% by weight) | 60% by weight |
| Photosensitive vehicle | |
| Methyl methacrylate copolymer Photopolymerization initiator Thermal polymerization inhibitor Photo-crosslinking agent Dye Solvent | 40% by weight |

It is important that the ceramic powders for the insulating paste have the same composition as that used in the multilayer ceramic wiring substrate. The bonding property is very excellent and the warpage of the substrate is as low as not higher than 20 μm even if an insulating layer having a thickness of 300 μm is formed on a substrate of 100 mm square.

Selection of the photosensitive vehicle and the optimum compounding ratio of the vehicle to the ceramic powders are critical to achieve at the same time the micro via holes which are not feasibly formed by a thick film screen printing process and a very low leakage current.

The photosensitive vehicle includes, for example, methyl methacrylate copolymer or the like. The compounding ratio of the ceramic powders to the photosensitive vehicle is in a range of 70/30-50/50 w/w %, preferably 60/40 w/w %.

The characteristics of the photo-setting insulating paste are listed in Table 3.

TABLE 3

| Characteristics | Values |
| --- | --- |
| Paste viscosity (P) | 800-900 |
| Dielectric constant (1 MHz) | 4.4 |
| Dielectric loss (%) | 0.2 |
| Insulation resistance ($\Omega \cdot cm$) | $>10^{14}$ |
| Leakage current ($\mu A$) | <5.0 |
|  | (50 $\mu m$ thick, 15 V) |
| Thermal expansion coefficient ($\times 10^{-7}$/°C.) | 32 |
| Surface smoothness ($\mu m$) | 1.5 |

Table 3 shows that main features of the insulating paste reside in that it has excellent pasting properties, a low leakage current and a high resolution.

A process for forming conductor wiring and a process for forming an insulating layer by using such a photo-setting insulating layer paste are shown in FIGS. 3 and 4, respectively. Gold is used as a conductor.

Figure 3A:
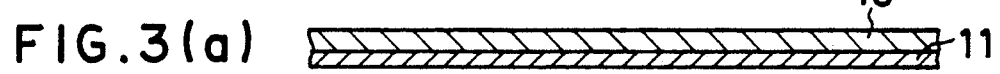
FIGS. 3(a) to 3(d) are views showing in detail a process for forming conductor wiring in a micro multilayer wiring portion in the process for manufacturing the substrate according to the present invention.
Figure 3B:
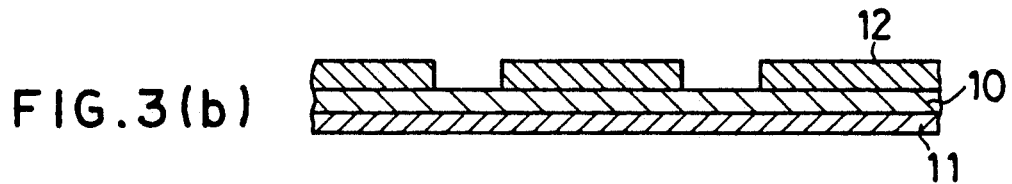
Figure 3C:
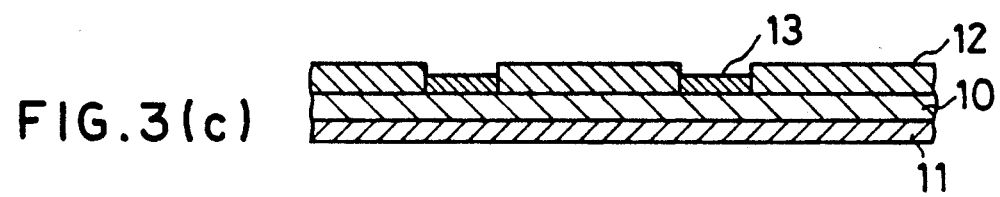
Figure 3D:

On forming the conductor, two films 10 and 11 which are formed of Ti and Pd, respectively, are firstly deposited on a substrate by sputtering as shown in FIG. 3(a). A photoresist 12 is coated thereon and is exposed to light for development so that a mask pattern is formed as shown in FIG. 3(b). Then, an Au wiring 13 is formed by selectively plating Au thereon as shown in FIG. 3(c). The conductor has a thickness of 10 $\mu m$ and a minimum wire width of 30 $\mu m$. The residual resist can be removed by burning it out at about 500° C. and Ti and Pd can also be removed by etching as shown in FIG. 3(d).

Figure 4A:
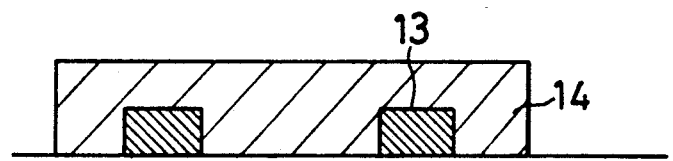
FIGS. 4(a) to 4(d) are views showing in detail a process for forming an insulating layer in the process for manufacturing the substrate according to the present invention.
Figure 4B:
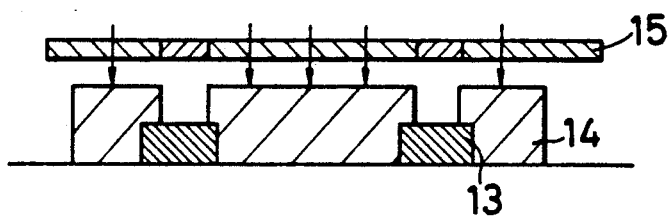
Figure 4C:
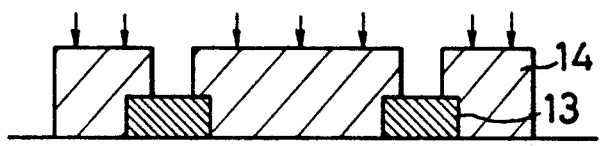
Figure 4D:
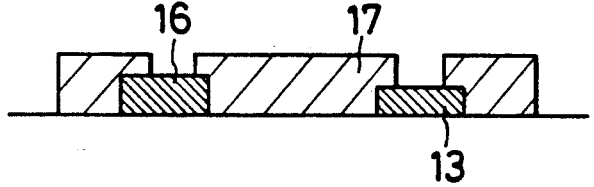

On forming the insulating layer, the photo-setting paste 14 for the insulating layer is screen printed and dried on the Au wiring 13 as shown in FIG. 4(a). The via hole pattern is formed by light exposure and development using a mask 15 as shown in FIGS. 4(b) and 4(c), respectively. The resolution of the via hole depends upon the film thickness and its aspect ratio is 1. Accordingly, if the film thickness after drying is about 50 $\mu m$, it is possible to form a via hole 16 having a diameter of 50 $\mu m$. A conductor paste is buried in the via hole. Thereafter, an insulating layer 17 having the via hole 16 is formed as shown in FIG. 4(d) by sintering the paste. The sintering is conducted in a belt furnace at 900° C.

In order to provide a multilayer wiring the process for forming the conductor and the process for forming the insulating layer are repeated several times. Finally, a chip mounting top metal (pad) layer is formed and several LSI chips 7 are mounted on the substrate.

The thus formed hybrid multilayer ceramic wiring substrate having a low dielectric constant has a line and space width and a via hole diameter which are reduced by about ⅛ and about ¼, respectively, than the limit values of the substrate which has been manufactured by the conventional green sheet lamination technique. The present substrate is very effective to provide micro wiring. If an optimum wiring design is performed for the control of the characteristic impedance and the reduction in crosstalk, the thickness of the insulating layer can be made considerably low. Accordingly, a high density of wiring in a sectional direction can be also obtained. The signal propagation delay time is as short as about 7 ns/m, which is reduced by about 35% in comparison to, for example, an alumina substrate.

The second embodiment of the present invention in which the ceramic material has the same composition as that of the first embodiment but isolated or closed voids are formed in a multilayer ceramic wiring substrate which will become a matrix will be described. A method of forming the closed voids is described in detail in Japanese Patent Public Disclosure No. 116196/1990 (Japanese Patent Application No. 269766/1988) and Japanese Patent Application No. 245066/1989. The process of the second embodiment is substantially identical with that of the first embodiment except that a void forming agent is added at the time when mixture powders or a slurry are formed.

The characteristics of the multiplayer ceramic wiring substrate including 13% by volume of closed voids are shown in Table 4.

TABLE 4

| Composition | Cordierite/quartz glass/borosilicate glass |
| --- | --- |
| Sintering temperature (°C.) | 950 |
| Density of sintered material (g/cm³) | 1.97 |
| Sintering shrinkage factor (%) | 15.6 |
| Shrinkage factor deviation (%) | $<\pm 0.3$ |
| Dielectric constant (1 MHz) | 3.4 |
| Dielectric loss (%) | 0.2 |
| Insulation resistance ($\Omega \cdot cm$) | $>10^{14}$ |
| Thermal expansion coefficient ($\times 10^{-7}$/°C.) | 32 |
| Flexural strength (kg/cm²) | 850 |
| Warpage ($\mu m$/100 mm) | 20 |
| Surface roughness ($\mu m$ Ra) | 0.5 |

Table 4 shows that main features of this substrate reside in that the substrate is very advantageous for high speed transmission of signals since the dielectric constant is as very low as 3.4 while the insulation properties can be sufficiently maintained and that it has a thermal expansion coefficient matched with Si independently of the presence or absence of voids. It is possible to form in such a substrate signal layers which are more than those of the first embodiment.

The hybrid multilayer ceramic wiring substrate in which a multilayer wiring is formed on a substrate in the same manner as the first embodiment can shorten the signal propagation delay time to about 6.5 ns/m. Accordingly, the resulting substrate is more advantageous for high speed transmission.

The third embodiment in which a ceramic composition including as ceramic materials 15% by weight of rock crystal (α-quartz), 20% by weight of quartz glass, and 65% by weight of borosilicate glass is used will be described. Borosilicate glass is the same as that of the first embodiment. The present composition is one of the compositions disclosed in Japanese Patent Public Disclosure No. 141153/1991 (Japanese Patent Application No. 275972/1989).

This ceramic composition is manufactured by the same process as that of the first embodiment.

The characteristics of the present substrate, the typical composition of the photo-setting insulating paste, and the characteristics of the photo-setting insulating paste are shown in Tables 5, 6 and 7, respectively.

TABLE 5

| Composition | Rock crystal (χ-quartz)/quartz glass/borosilicate glass |
|---|---|
| Sintering temperature (°C.) | 950 |
| Density of sintered material (g/cm$^3$) | 2.21 |
| Sintering shrinkage factor (%) | 13.9 |
| Shrinkage factor deviation (%) | <±0.3 |
| Dielectric constant (1 MHz) | 4.2 |
| Dielectric loss (%) | 0.1 |
| Insulation resistance (Ω · cm) | >10$^{13}$ |
| Thermal expansion coefficient (× 10$^{-7}$/°C.) | 31 |
| Floexural strength (kg/cm$^2$) | 1400 |
| Warpage (μm/100 mm) | 20 |
| Surface roughness (μm Ra) | 0.4 |

Table 5 shows that the main features of this substrate residue in that the dielectric constant is as low as 4.2 similarly to the first embodiment and that the thermal expansion coefficient is approximate to that of Si. It is possible to form in the substrate signal layers which are more than those of the first embodiment.

TABLE 6

| Component | Ratio |
|---|---|
| Ceramic powders | |
| Rock crystal (χ-quartz) (15% by weight) | 60% by weight |
| Quartz glass (20% by weight) | |
| Borosilicate glass (65% by weight) | |
| Photosensitive vehicle | |
| Methyl methacrylate copolymer | 40% by weight |
| Photopolymerization initiating agent | |
| Photo-crosslinking agent | |
| Dye | |
| Solvent | |

It is preferable that the ceramic powders for the insulating paste which have the same composition as those used for the above mentioned multilayer ceramic wiring substrate are used similarly to the first embodiment to sufficiently maintain the reliability on connection, bonding properties, and suppression of warpage of the substrate.

On the other hand, selection of photosensitive vehicle and the optimum compounding ratio of the vehicle to the ceramic powders are similar to the first embodiment.

TABLE 7

| Characteristics | Values |
|---|---|
| Paste viscosity (P) | 800-900 |
| Dielectric constant (1 MHz) | 4.2 |
| Dielectric loss (%) | 0.1 |
| Insulation resistance (Ω · cm) | >10$^{13}$ |
| Leakage current (μA) | <5.0 (50 μm thick, 15 V) |
| Thermal expansion coefficient (× 10$^{-7}$/°C.) | 31 |
| Surface smoothness (μm) | 1.5 |

Table 7 shows that the paste properties are excellent, the leakage current is low and the resolution is high similarly to the first embodiment. The hybrid multilayer ceramic wiring substrate having a low dielectric constant is manufactured by the process similar to the first embodiment using such a ceramic material.

As mentioned above, in accordance with the present invention, a micro multilayer wiring can be formed. Accordingly, an ultra high speed LSI chip mounting substrate can be provided. The present invention can largely contribute to an advance in high density micro wiring and high speed signal transmission.

What is claimed is:

1. A process for manufacturing a hybrid multilayer ceramic wiring substrate having a low dielectric constant comprising a conductor wiring forming step and an insulating layer forming step,
    said conductor wiring forming step comprising the steps of:
    applying a photoresist upon a multilayer ceramic wiring substrate in which a plurality of conductor layers are laminated via an insulation layer formed of a low temperature sinterable ceramic composition having a low dielectric constant;
    exposing the photoresist to light and developing the exposed photoresist to form a mask pattern; and
    selectively metal plating the mask pattern;
    said insulating layer forming step comprising the steps of:
    printing a photo-setting paste for an insulating layer on the multilayer ceramic wiring substrate and drying the paste;
    forming a via hole pattern by light exposure and development using a mask; and
    burying and sintering a conductor paste into via holes; and
    a micro multilayer wiring being formed by a combination of said conductor wiring forming step and said insulating layer forming step.

2. A process for manufacturing a hybrid multilayer ceramic wiring substrate as defined in claim 1 wherein said conductor layers comprise a Ti film and a Pd film.

3. A process for manufacturing a hybrid multilayer ceramic wiring substrate as defined in claim 1 wherein said low temperature sinterable ceramic composition comprises one or more materials selected from the group consisting of cordierite, rock crystal, quartz glass and borosilicate glass.

4. A process for manufacturing a hybrid multilayer ceramic wiring substrate as defined in claim 3 wherein said borosilicate glass comprises as main components silicon oxide, boron oxide, aluminum oxide, an oxide of an element of group I, an oxide of an element of group II, and titanium oxide.

5. A process for manufacturing a hybrid multilayer ceramic wiring substrate as defined in claim 1 wherein said plating step is carried out with Au.

6. A process for manufacturing a hybrid multilayer ceramic wiring substrate as defined in claim 1 wherein said photo-setting paste comprises a low temperature sinterable ceramic composition having the same composition as that of said ceramic composition in the conductor wiring forming step and a photosensitive vehicle.

7. A process for manufacturing a hybrid multilayer ceramic wiring substrate as defined in claim 6 wherein said photosensitive vehicle comprises a methyl methacrylate copolymer, photopolymerization initiator, thermal polymerization inhibitor, photo-crosslinking agent, dye and solvent.

8. A process for manufacturing a hybrid multilayer ceramic wiring substrate as defined in claim 6 wherein a ratio of said low temperature sinterable ceramic composition to said photosensitive vehicle is in a range of 70/30-50/50 w/w %.

9. A process for manufacturing a hybrid multilayer ceramic wiring substrate as defined in claim 6 wherein said low temperature sinterable ceramic composition comprises one or more materials selected from the group consisting of cordierite, rock crystal, quartz glass and borosilicate glass.

10. A process for manufacturing a hybrid multilayer ceramic wiring substrate as defined in claim 9 wherein said borosilicate glass comprises as main components silicon oxide, boron oxide, aluminum oxide, an oxide of an element of group I, an oxide of an element of group II, and titanium oxide.

11. A process for manufacturing a hybrid multilayer ceramic wiring substrate as defined in claim 1 wherein said multilayer ceramic wiring substrate includes isolated voids formed therein.

12. A process for manufacturing a hybrid multilayer ceramic wiring substrate as defined in claim 1 wherein said conductor paste is selected from gold, silver or silver-palladium paste.

* * * * *